(12) United States Patent
Fan et al.

(10) Patent No.: US 12,160,980 B2
(45) Date of Patent: Dec. 3, 2024

(54) POWER SUPPLY DEVICE

(71) Applicant: Delta Electronics (Shanghai) Co., Ltd., Shanghai (CN)

(72) Inventors: Bing Fan, Shanghai (CN); Yucai Zhao, Shanghai (CN); Li Zhu, Shanghai (CN); Yichao Wang, Shanghai (CN); Kai Dong, Shanghai (CN)

(73) Assignee: Delta Electronics (Shanghai) Co.,Ltd., Shanghai (CN)

( * ) Notice: Subject to any disclaimer, the term of this patent is extended or adjusted under 35 U.S.C. 154(b) by 411 days.

(21) Appl. No.: 17/657,361

(22) Filed: Mar. 31, 2022

(65) Prior Publication Data

US 2022/0354023 A1 Nov. 3, 2022

(30) Foreign Application Priority Data

Apr. 29, 2021 (CN) .......................... 202110471324.3

(51) Int. Cl.
| | |
|---|---|
| *H05K 7/20* | (2006.01) |
| *H02M 1/42* | (2007.01) |
| *H02M 1/44* | (2007.01) |
| *H02M 3/00* | (2006.01) |
| *H05K 7/14* | (2006.01) |

(52) U.S. Cl.
CPC .......... *H05K 7/20736* (2013.01); *H02M 1/42* (2013.01); *H02M 1/44* (2013.01); *H02M 3/003* (2021.05); *H05K 7/1492* (2013.01)

(58) Field of Classification Search
CPC ............ G06F 1/26; G06F 1/185; H02M 1/42; H02M 3/003; H02M 1/44; H05K 7/20909; H05K 7/20172; H05K 1/0203; H05K 1/0209; H05K 2201/10189; H05K 5/0021; H05K 7/20136; H05K 7/20736; H05K 7/2089; H05K 7/209; H05K 1/0207; H05K 1/0233; H05K 5/0026; H05K 7/14322;
(Continued)

(56) References Cited

U.S. PATENT DOCUMENTS 6,930,883 B2 * 8/2005 Hsieh ................ H05K 7/20909
361/695
8,570,741 B2 * 10/2013 Liu .......................... G06F 1/26
361/679.48
(Continued)

FOREIGN PATENT DOCUMENTS

| CN | 201504176 U | 6/2010 |
|---|---|---|
| CN | 206389177 U | 8/2017 |

*Primary Examiner* — Michael A Matey
(74) *Attorney, Agent, or Firm* — CKC & Partners Co., LLC

(57) ABSTRACT

The application provides a power supply device comprising two input ports disposed at a front end of the power supply device; at least one fan disposed behind the two input ports and two isolated power supplies connected respectively to the corresponding one of the two input ports and disposed behind the two input ports and the at least one fan. Each of the isolated power supplies comprises a main power circuit having at least one module, and each module comprises a PCB and a magnetic element and/or switching devices. The at least one module includes an isolated circuit module comprises a transformer having windings formed by laying copper in the PCB and the magnetic core fixed on the PCB. And at least one fan is configured for heat dissipation of the at least one module.

25 Claims, 19 Drawing Sheets

(58) Field of Classification Search
CPC ...... H05K 7/1492; H05K 7/20; H05K 7/2039; H01R 13/6675; H02J 7/02; H02J 9/06
See application file for complete search history.

(56) References Cited

U.S. PATENT DOCUMENTS

| | | | | |
|---|---|---|---|---|
| 9,229,504 B1* | 1/2016 | Marr | ........................ | G06F 1/263 |
| 10,312,823 B1* | 6/2019 | Montgomery | .......... | H02M 7/44 |
| 2002/0006027 A1* | 1/2002 | Rodriguez | ......... | H05K 7/20909 |
| | | | | 361/688 |
| 2005/0030711 A1* | 2/2005 | Tsai | .......................... | G06F 1/20 |
| | | | | 361/679.48 |
| 2005/0052164 A1* | 3/2005 | Sakai | ........................ | H02J 9/06 |
| | | | | 323/222 |
| 2005/0213305 A1* | 9/2005 | Martin | ................. | H05K 5/0091 |
| | | | | 361/714 |
| 2006/0050480 A1* | 3/2006 | Yu | ............................. | G06F 1/20 |
| | | | | 361/679.48 |
| 2007/0081306 A1* | 4/2007 | Wong | ........................ | G06F 1/26 |
| | | | | 361/695 |
| 2007/0279865 A1* | 12/2007 | Yoshida | ............. | H05K 7/20909 |
| | | | | 165/299 |
| 2010/0215520 A1* | 8/2010 | Chin | ..................... | F04D 29/582 |
| | | | | 417/405 |
| 2012/0293153 A1* | 11/2012 | Garb | .................. | H01R 13/6675 |
| | | | | 323/311 |
| 2013/0027887 A1* | 1/2013 | Osato | ................. | H05K 7/20909 |
| | | | | 361/709 |
| 2014/0183956 A1* | 7/2014 | Wang | ..................... | H02J 9/062 |
| | | | | 307/64 |
| 2015/0078042 A1* | 3/2015 | Standing | ................. | H02M 7/06 |
| | | | | 363/67 |
| 2018/0095431 A1* | 4/2018 | Lee | ......................... | H02M 3/04 |
| 2018/0213687 A1* | 7/2018 | Lu | ...................... | H05K 7/20254 |
| 2019/0297749 A1* | 9/2019 | Bernardin | ............ | H05K 7/1492 |

* cited by examiner

POWER SUPPLY DEVICE

CROSS-REFERENCE TO RELATED APPLICATIONS

This non-provisional application claims the priority under 35 U.S.C. § 119 (a) on Patent Application No. 202110471324.3 filed in P. R. China on Apr. 29, 2021, the entire contents of which are hereby incorporated by reference.

Some references, if any, which may include patents, patent applications and various publications, may be cited and discussed in the description of this application. The citation and/or discussion of such references, if any, is provided merely to clarify the description of the present application and is not an admission that any such reference is "prior art" to the present application described herein. All references listed, cited and/or discussed in this specification are incorporated herein by reference in their entireties and to the same extent as if each reference was individually incorporated by reference.

FIELD OF THE INVENTION

The application relates to the field of power electronics technology, and particularly to a power supply device.

BACKGROUND OF THE INVENTION

Power supplies for network servers are mostly configured in a N+N redundancy mode, such as 1+1, 2+2, and 4+4 redundancy configurations.

Assuming that a rated power of a system is 3 kW, when using 1.5 kW power supplies, four of such power supplies are required and configured into the 2+2 redundancy configuration. When using 3 kW power supplies, only two of such power supplies are required and configured into the 1+1 redundancy configuration. Since the input current of the 3 kW power supply is twice of the 1.5 kW power supply, the corresponding input connector should be replaced with one having stronger withstand current capability, such as upgrading from the C14 connector to the C20 connector. However, the replacing of the connector may directly change the original power distribution architecture in the data center, which may significantly increase the investment cost of the infrastructure of the data center.

SUMMARY OF THE INVENTION

An object of the application is to provide a power supply device, which can solve one or more deficiencies in the prior art.

To realize the above object, according to one embodiment of the application, a power supply device is provided, which comprises two input ports disposed at a front end of the power supply device; at least one fan disposed behind the two input ports; and two isolated power supplies connected respectively to the corresponding one of the two input ports and disposed behind the two input ports and the at least one fan, each of the isolated power supplies comprising a main power circuit having at least one module, each module comprising a printed circuit board (PCB) and a magnetic element and/or switching devices disposed on the PCB, wherein the at least one module includes an isolated circuit module comprising a transformer having windings formed by laying copper in the PCB and a magnetic core fixed on the PCB, wherein the at least one fan is configured for heat dissipation of the at least one module.

The present application provides a power supply device with double paths of input, which can keep the original input connectors unchanged without changing the existing power distribution architecture to save the cost. For example, two 1.5 kW power supply modules can be integrated into one power supply chassis to make a 3 kW power supply. Compared with the traditional single-input power supply device, the components of the double-input power supply device of the present application are doubled, making a big challenge in the aspects of insulation and heat dissipation. Therefore, the double-input power supply device of the present application adopts a module design, provides sufficient insulating distance and optimizes air channels to ensure a good heat dissipation effect.

The additional and/or alternative aspects and/or advantages of the application will be partially explained in the below description, and will partially become apparent from the description or can be obtained through the practice of the application.

BRIEF DESCRIPTION OF THE DRAWINGS

Exemplary embodiments are described in details with reference to the accompanying drawings, through which the above and other features and advantages of the application will become more apparent.

DETAILED EMBODIMENTS OF THE INVENTION

Figure 1A:
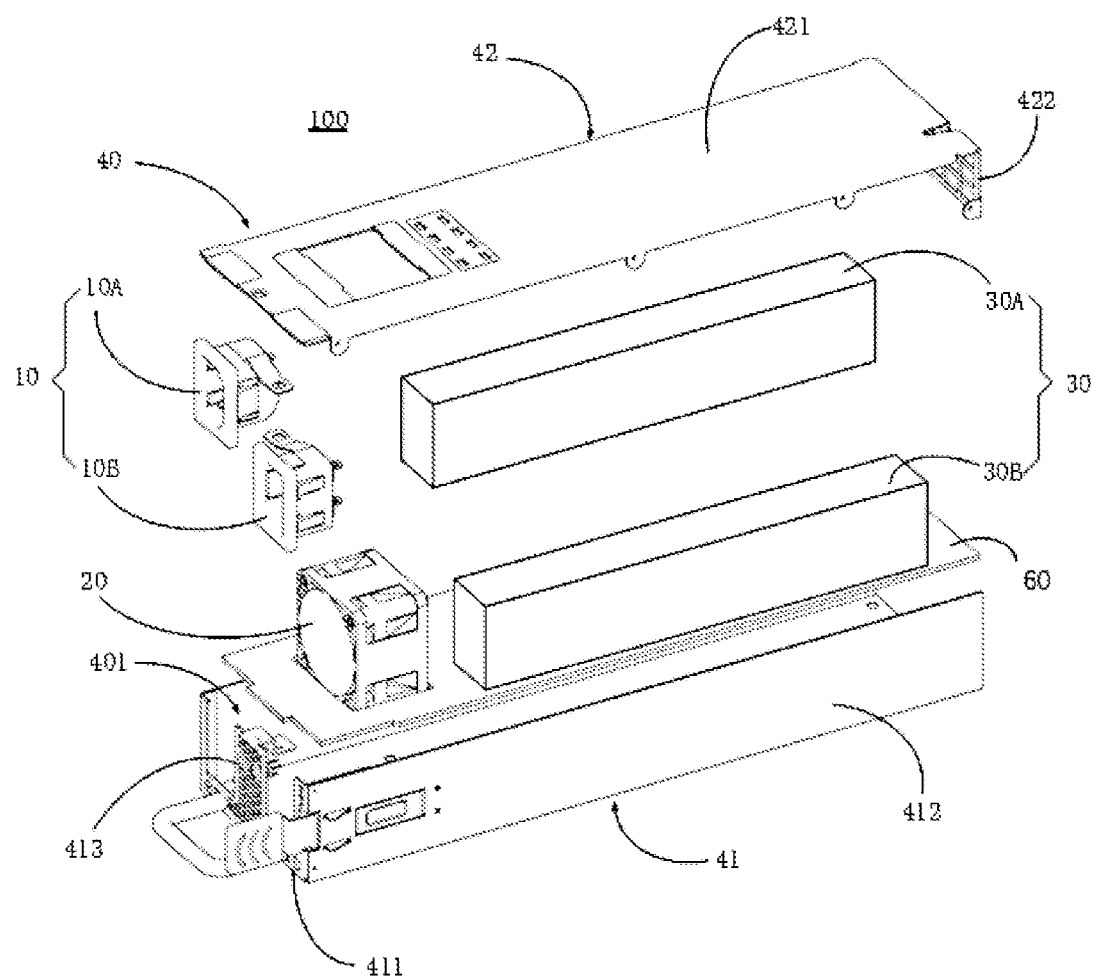
FIG. 1A is a schematic diagram of the exploded structural of a power supply device according to the application before being assembled.

The exemplary embodiments will now be described more fully with reference to the accompanying drawings. However, the exemplary embodiments can be implemented in various forms and shall not be understood as being limited to the embodiments set forth herein; on the contrary, these embodiments are provided so that this application will be thorough and complete, and the conception of exemplary embodiments will be fully conveyed to those skilled in the art. In the drawings, the same reference sign denotes the same or similar structure, so their detailed description will be omitted.

When factors/components/the like described and/or illustrated here are introduced, the phrases "one", "a", "an", "the", "said" and "at least one" refer to one or more factors/components/the like. The terms "include", "comprise" and "have" refer to an open and included meaning, and refer to additional factors/components/the like, in addition to the listed factors/components/the like. The embodiments may use relative phrases, such as, "upper" or "lower" to describe a relative relation of one signed component over another component. It shall be understood that if the signed device reverses to turn upside down, the described component on an "upper" side will become a component on a "lower" side. In addition, the terms "first", "second" and the like in the claims are only used as signs, instead of numeral limitations to objects.

Figure 1B:
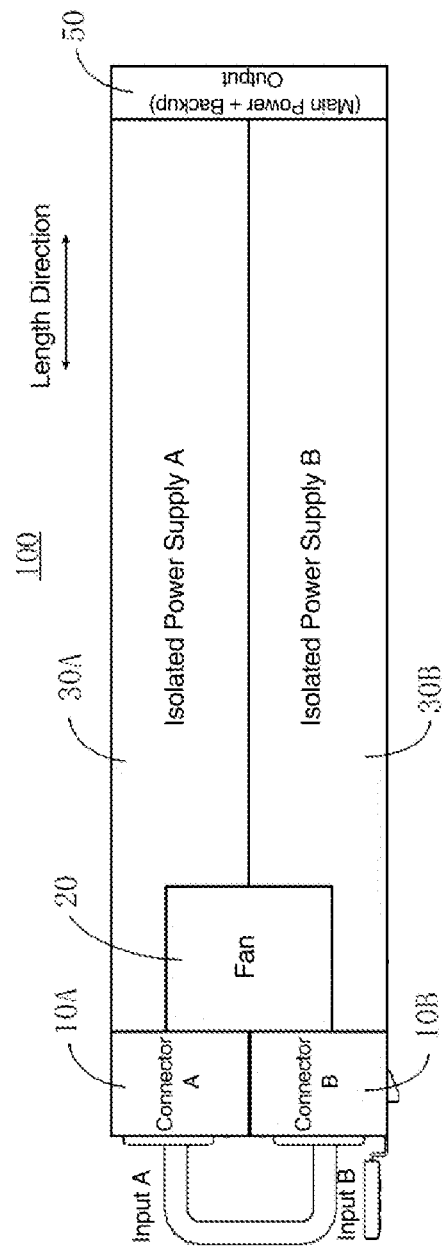
FIG. 1B is a schematic diagram of the internal layout of the power supply device according to the application.
Figure 4A:
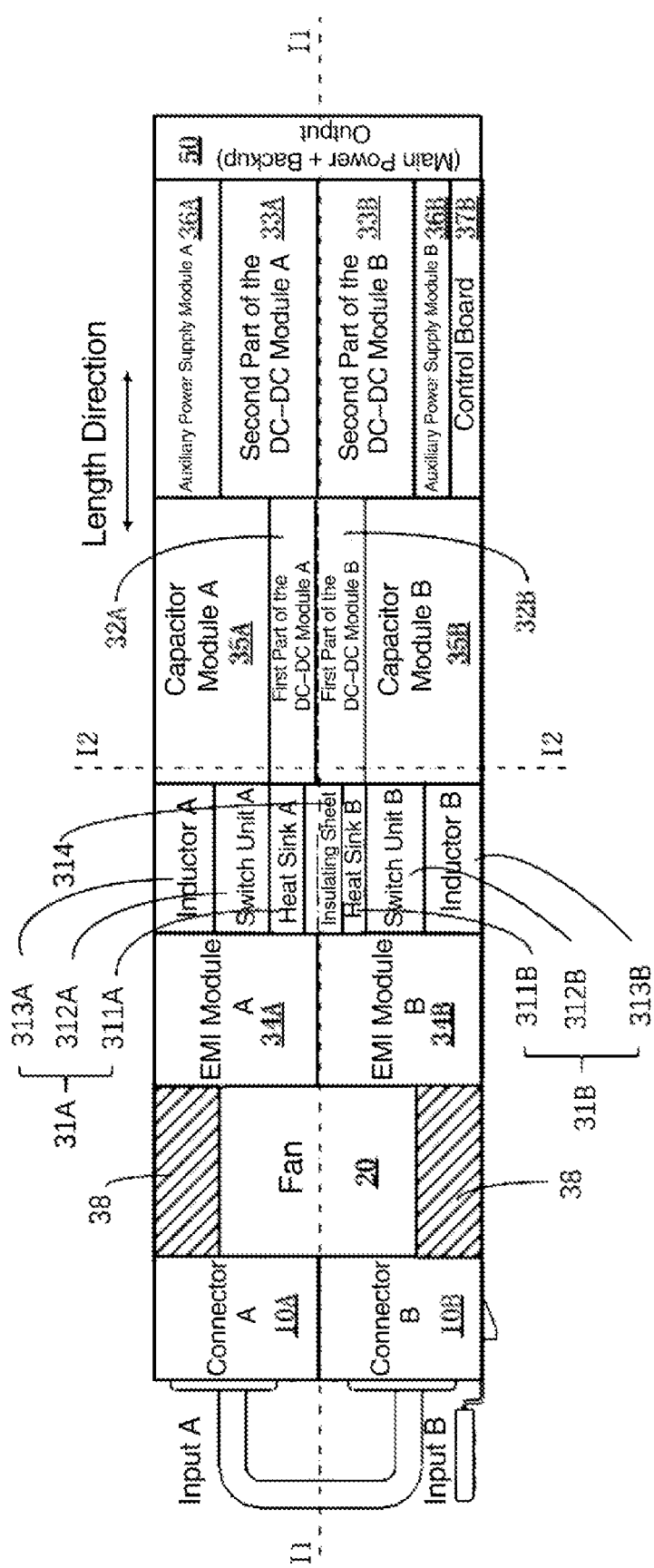
FIG. 4A is a layout diagram of a plurality of modules of the power supply device according to the application.
Figure 4B:
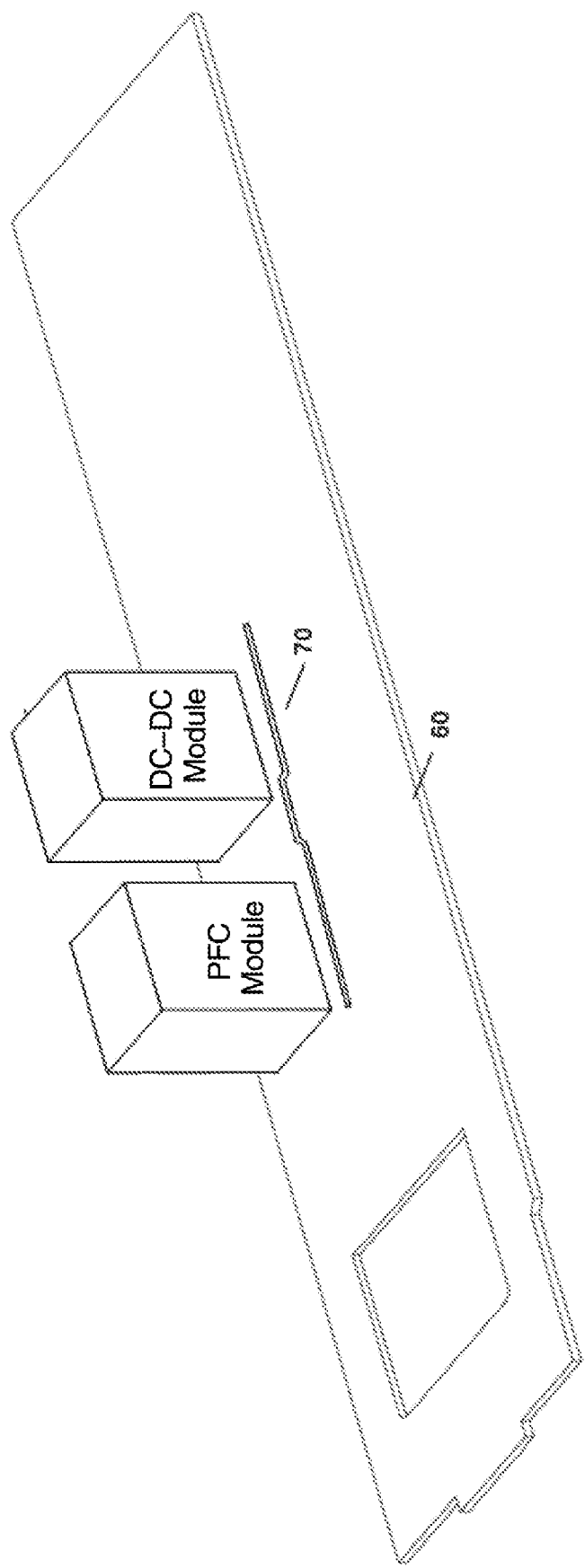
FIG. 4B is a schematic diagram showing a slot on the mainboard which is further provided between the two at least one module of the two isolated power supplies of the present application.
Figure 4C:
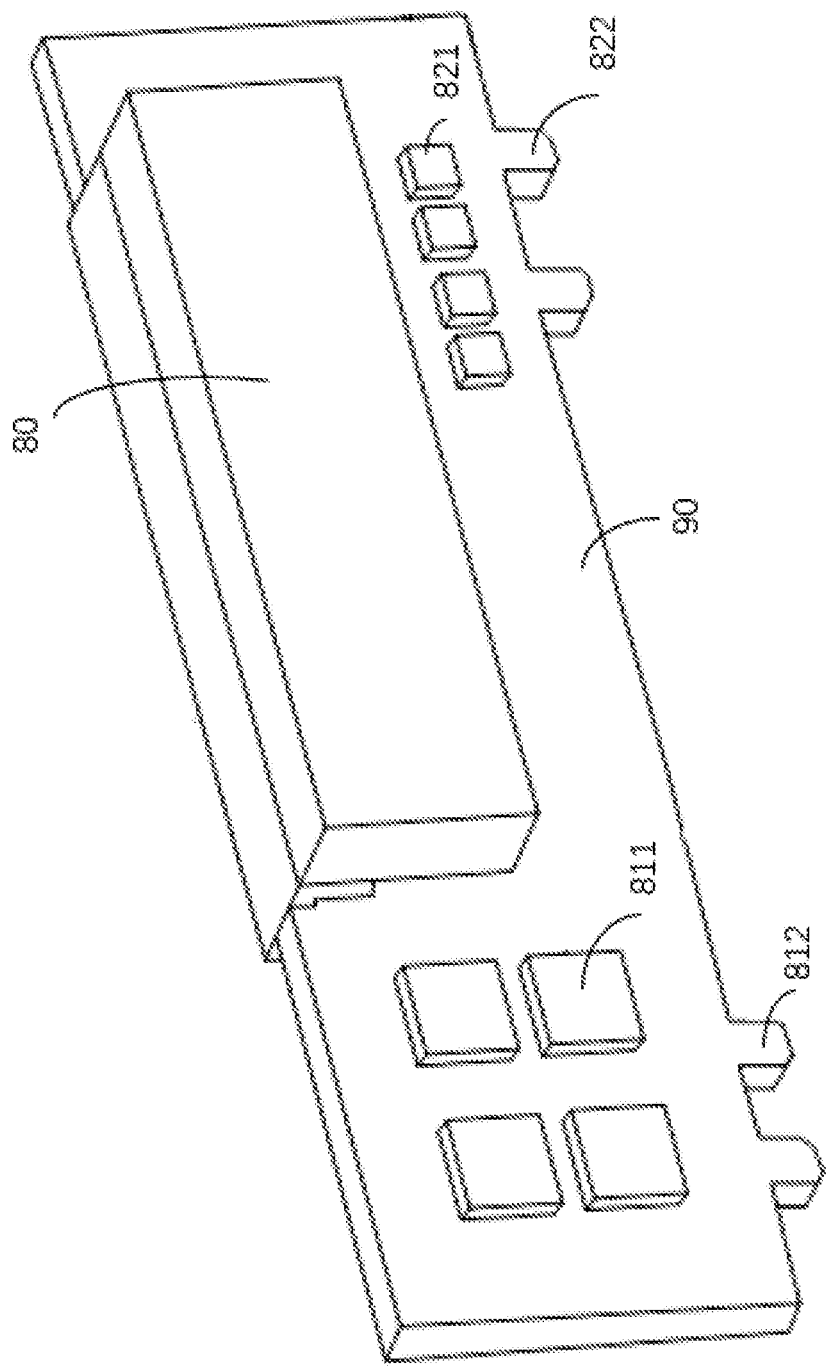
FIG. 4C is a structural diagram of a transformer in an isolated circuit module of the power supply device according to the application.

As shown in FIGS. 1A, 1B and 4C, the present application provides a power supply device 100, which may comprise two input ports 10, at least one fan 20 and two isolated power supplies 30. The two input ports 10, which for example include a first input port 10A and a second input port 10B, are disposed at a front end of the power supply device. The at least one fan 20 is disposed behind the two input ports 10. The two isolated power supplies 30, which include a first isolated power supply 30A and a second isolated power supply 30B, are connected respectively to corresponding one of the two input ports 10, for example, the first isolated power supply 30A is connected to the first input port 10A and the second isolated power supply is connected to the second input port 10B, and are disposed behind the two input ports 10 and the at least one fan 20. In the application, each isolated power supply 30 has a main power circuit that may comprise at least one module. Each module comprises a PCB and a magnetic element and/or switching devices disposed on the PCB. The at least one module of the isolated power supplies 30 comprises an isolated circuit module, which, for example, may be but not limited to a DC-DC module. The isolated circuit module comprises a transformer 80, which comprises windings that may be formed through laying copper in the PCB 90, and a magnetic core that may be fixed on the PCB 90. The at least one fan 20 is configured for heat dissipation of the at least one module.

In some embodiments, the two input ports 10 (including 10A and 10B), for example, may be the C14 connectors or the C20 connectors, wherein a connector may be configured to connect an input A, and a connection B may be configured to connect an input B.

Figure 1C:
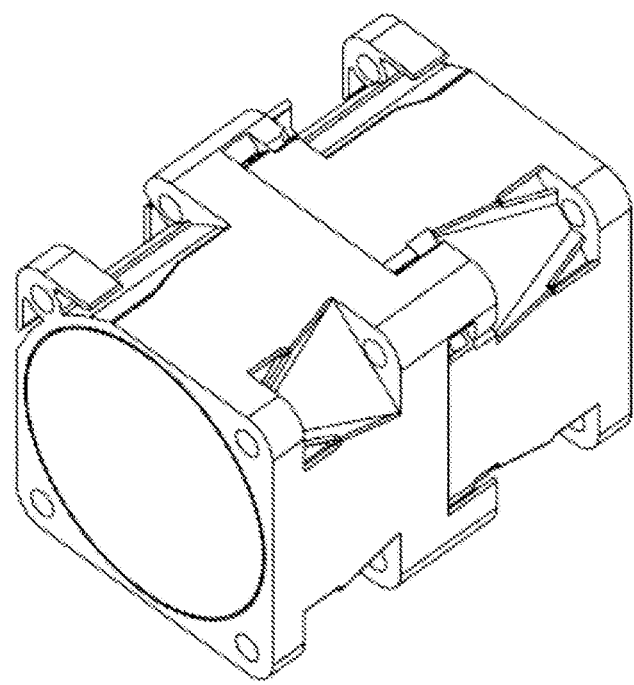
FIG. 1C is a schematic diagram of a series connection structure of two fans of the power supply device according to the application.

In this embodiment, the power supply device 100 comprises a fan 20. In other embodiments, as shown in FIG. 1C, the power supply device 100 may comprise two fans connected in series and disposed behind the two input ports 10.

In some embodiments, the inputs of the two isolated power supplies 30 (including 30A and 30B) may be alternating current (AC) inputs or DC inputs. That is to say, the inputs of the two isolated power supplies 30 may be configured to receive AC power or DC power. Moreover, each of the isolated power supplies 30 may further comprise a bypass circuit, which, for example, may comprise an output circuit of an auxiliary power supply. In some embodiments, each of the isolated power supplies 30 may have one main power output and one bypass power output. In such way, the power supply device 100 of the present application can have double inputs and double outputs.

Figure 2:
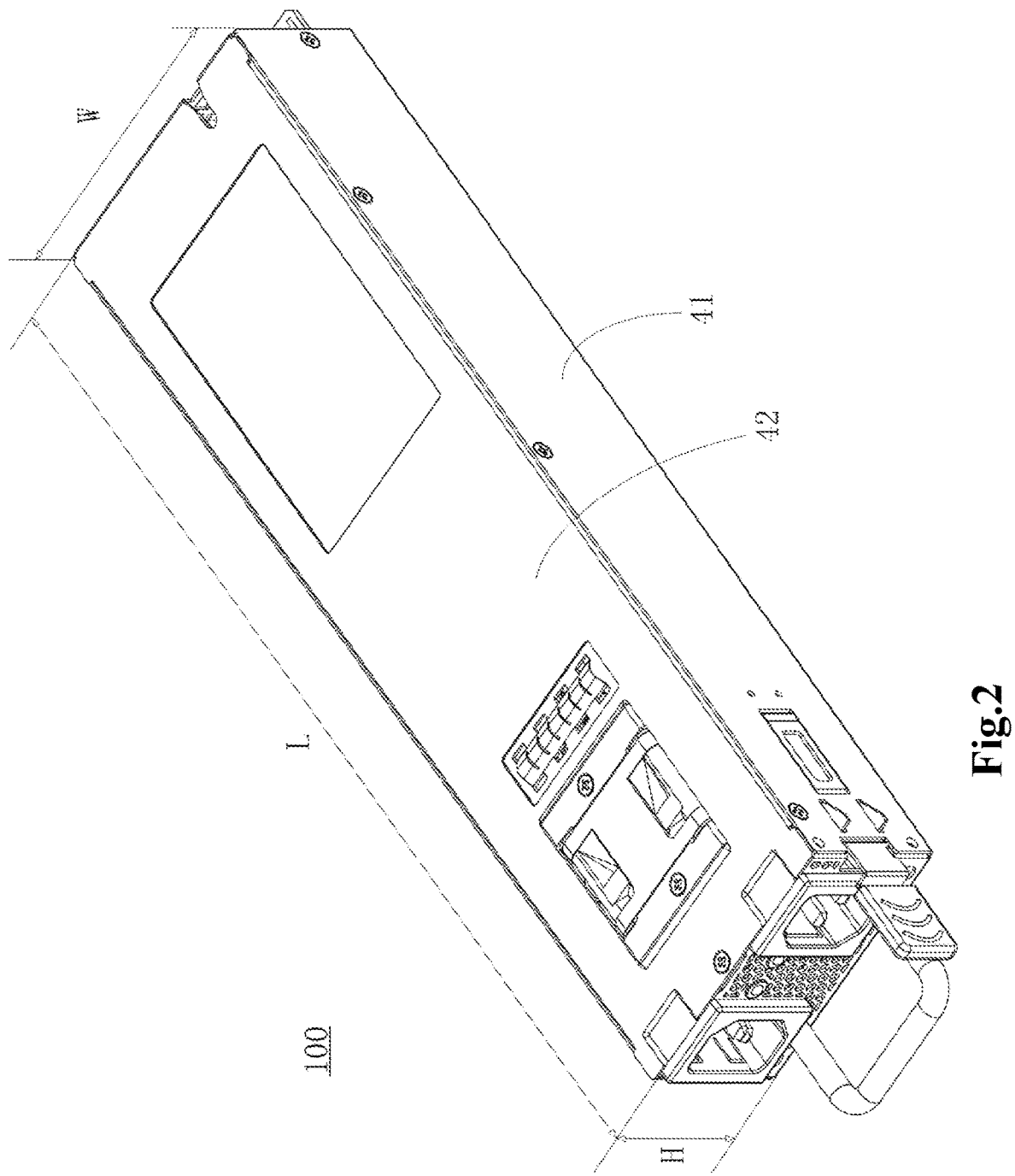
FIG. 2 is a schematic diagram of a three-dimensional structure of the assembled power supply device according to the application.

As shown in FIG. 1A, the power supply device 100 may further comprise a chassis 40 that forms an space 401 for accommodating the two input ports 10, the at least one fan 20, and the two isolated power supplies 30. As shown in FIG. 2, which illustrates the three-dimensional structure of the assembled power supply device 100 according to the present application. The chassis of the power supply device 100 may have outer dimensions of about 38 to 46 mm in the height H, and about 60 to 80 mm in the width W. In some embodiments, for example, the power supply device 100 may have outer dimensions in length L*width W*height H of about 265 mm*73.5 mm*40 mm, and a power density of, for example, 78 W/inch$^3$. It should be understood that, in other embodiments, the power supply device of the application can be configured into other suitable dimensions.

Figure 3A:
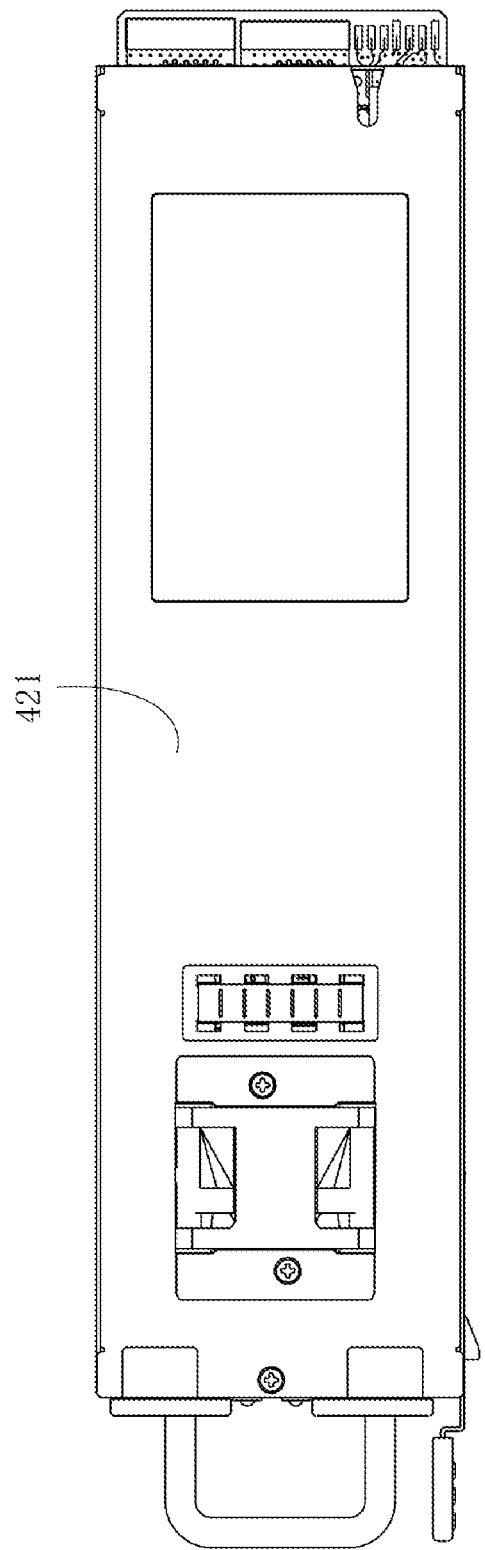
FIG. 3A is a top view of FIG. 2
Figure 3B:
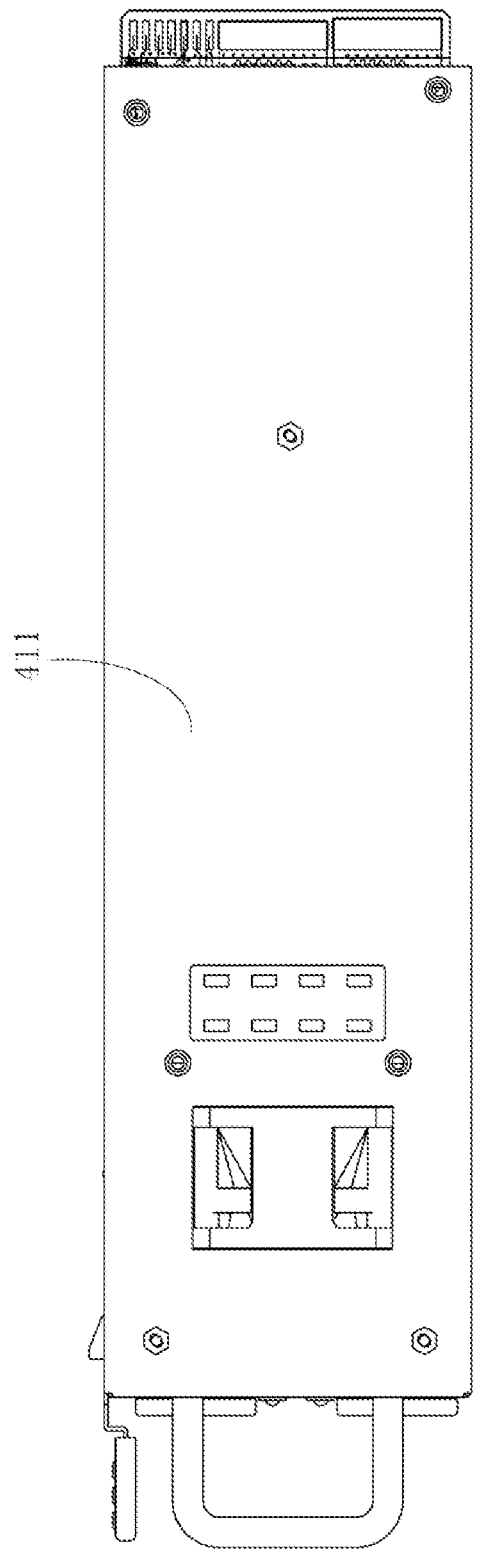
FIG. 3B is a bottom view of FIG. 2.
Figure 3C:
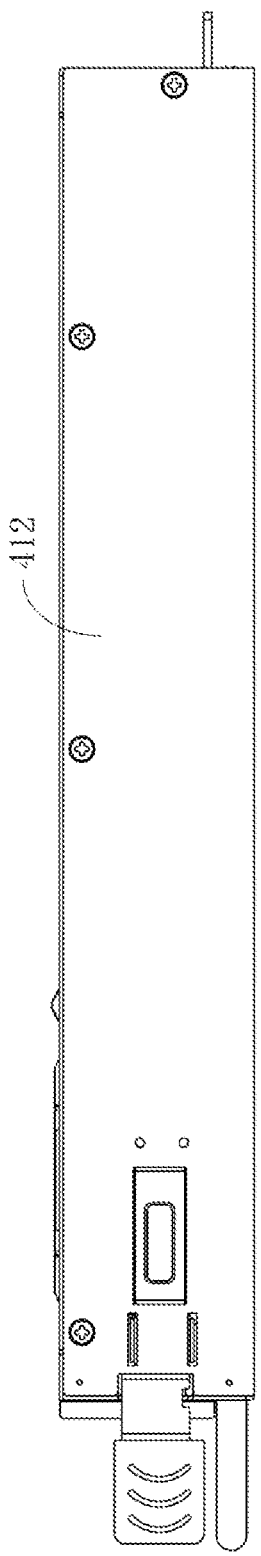
FIG. 3C is a right view of FIG. 2.
Figure 3D:
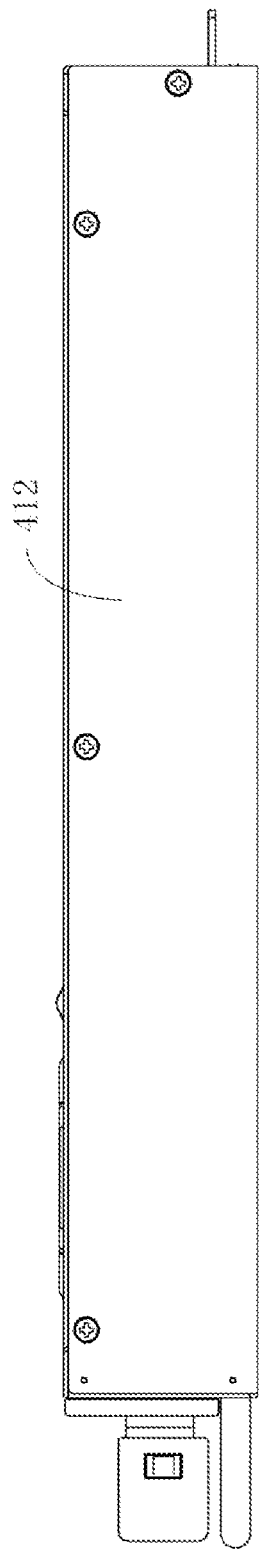
FIG. 3D is a left view of FIG. 2.
Figure 3E:
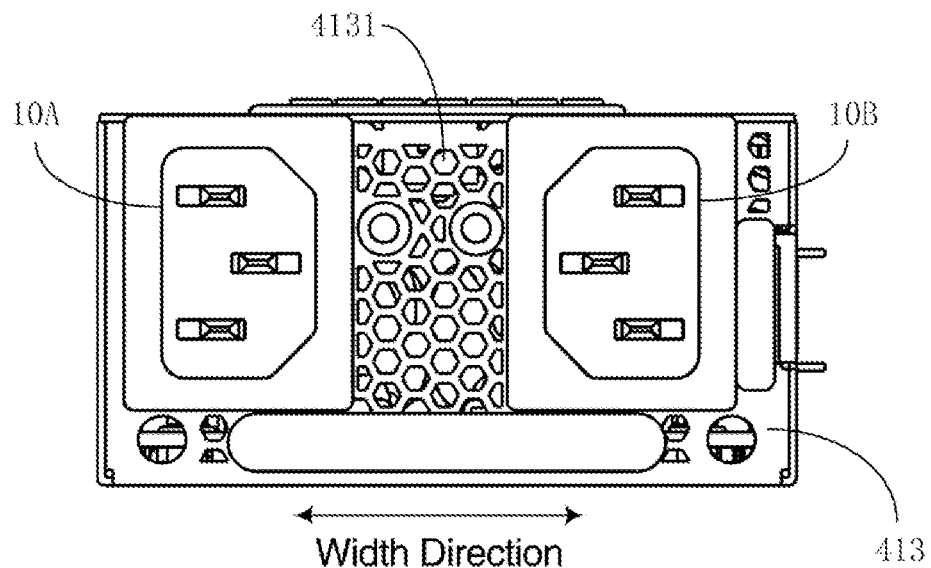
FIG. 3E is a front view of FIG. 2.
Figure 3F:
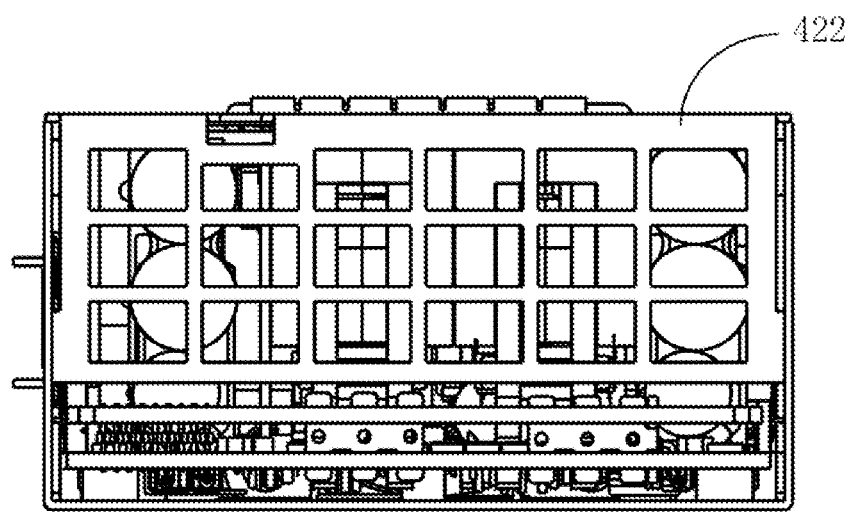
FIG. 3F is a rear view of FIG. 2.

In this embodiment, referring to FIGS. 1A and 3A to 3F, the chassis 40, for example, may be assembled by a lower chassis 41 and an upper chassis 42. The lower chassis 41, for example, may comprise a bottom plate 411 at the bottom of the chassis, two side plates 412 at both sides of the chassis, and a front panel 413 at the front end of the chassis. The upper chassis 42, for example, may comprise a top plate 421 at the top of the chassis and a rear panel 422 at the rear end of the chassis. The two input ports 10 (i.e. the first input 10A and the second input 10B), for example, may be arranged in parallel on the front panel 413 along a width direction of the power supply device 100, as shown in FIG. 3E, wherein the width direction is perpendicular to a direction where the two input ports, the at least one fan and the two isolated power supplies are arranged in sequence. The front panel 413 may have a plurality of venting holes 4131, which are concentrated between the two input ports (i.e. the first input 10A and the second input 10B) and disposed corresponding to the fan 20. An air channel can be optimized by adjusting the heights and the spaces of the components in front and/or back of the fan 20 to improve the heat emission efficiency. Specifically, the fan 20 may be suspended and fixed on the top plate 421 of the chassis 42. In addition, the power supply device 100 may further comprise a mainboard 60, and the two isolated power supplies, i.e., the first isolated power supply 30A and the second isolated power supply 30B, are disposed on the mainboard 60. In some embodiments, the mainboard 60 is provided with a through hole at a position corresponding to fan 20, and the fan 20 is fixed on the bottom plate 411 through the hole of the mainboard 60.

In some embodiments, in the present application, as shown in FIG. 4A, the at least one module further comprises at least one of a power factor correction (PFC) module, a DC-DC module, an electromagnetic interference (EMI) module, a capacitor module, and an auxiliary power supply module. Moreover, each of the isolated power supplies 30 may adopt a module design. And "module design" refers to disposing the magnetic element and/or the switching devices on the PCB to form a module. In particular, the module design can significantly improve the manufacturability of the power supply device and reduce production cost. Furthermore, it can save the internal space of the power supply device, improve the thermal distribution, and increase the heat emission efficiency. It also can provide sufficient creepage distance, thereby improving the insulating effect between the two isolated power supplies 30.

In the application, as shown in FIG. 1B, the isolated power supply 30 may be configured as a single-stage circuit, or a two-stage circuit. As shown in FIG. 4A, the two isolated power supplies 30 (i.e. a first isolated power supply 30A and a second isolated power supply 30B) are symmetrically arranged relative to a width central axis of the power supply device 100, wherein the width central axis is a center line of the width of the power supply device 100. And when the isolated power supply 30 is configured as the two-stage circuit, the isolated power supply 30 may comprise a front-stage circuit and a post-stage circuit, wherein the front-stage circuit, for example, may comprise a PFC circuit, and the post-stage circuit, for example, may comprise a DC-DC circuit. For example, the first isolated power supply 30A of a path A is a two-stage isolated power supply A, which has a front-stage circuit comprising a PFC module 31A and a post-stage circuit comprising a DC-DC module A. The PFC module 31A comprises a heatsink 311A, a switch unit 312A and an inductor 313A, which are arranged outwardly in sequence from the width central axis I1-I1 along the width direction of the power supply device 100. The DC-DC module A may be composed of two parts. A first part 32A of the DC-DC module A may be, for example, a primary circuit of the DC-DC module A, while a second part 33A of the DC-DC module A may be, for example, a secondary circuit of the DC-DC module A. The first part 32A and the second part 33A of the DC-DC module A are arranged in sequence along the width central axis I1-I1 of the power supply device 100.

The second isolated power supply 30B of a path B is a two-stage isolated power supply B, which has a front-stage circuit comprising a PFC module 31B and a post-stage circuit comprising a DC-DC module B. The PFC module 31B comprises a heatsink 311B, a switch unit 312B, and an inductor 313B, which are arranged outwardly in sequence from the width central axis I1-I1 along the width direction of the power supply device 100. The DC-DC module B may be composed of two parts. A first part 32B of the DC-DC module B may be, for example, a primary circuit of the DC-DC module B, while a second part 33B of the DC-DC module B may be, for example, a secondary circuit of the DC-DC module B. The first part 32B and the second part 33B of the DC-DC module B are arranged in sequence along the width central axis I1-I1 of the power supply device 100.

It can be understood that the primary circuit and the secondary circuit of the DC-DC module of the isolated power supplies 30 may be integrated as an entire module, and arranged along the width central axis I1-I1. In some embodiments, the first isolated power supply 30A of the path A may further comprise an EMI module 34A, a capacitor module 35A, and an auxiliary power supply module 36A, while the second isolated power supply 30B of the path B may further comprise an EMI module 34B, a capacitor module 35B, and an auxiliary power supply module 36B. The outputs of the auxiliary power supply modules 36A and 36B may be connected to form the bypass output. Two main power outputs, from the first isolated power supply 30A and the second isolated power supply 30B can be connected to supply a load via an output terminal 50. In the application, at least one module of the first isolated power supply 30A of the path A and the second isolated power supply 30B of the path B may be arranged respectively on both sides of the width central axis I1-I1 of the power supply device 100 along a length direction of the power supply device 100. For example, the first isolated power supply 30A is arranged at the right side of the width central axis I1-I1, while the second isolated power supply 30B is arranged at the left side of the width central axis I1-I1. And a plurality of air channels are formed in the length direction, wherein the length direction is the direction where the two input ports, the at least one fan and the two isolated power supplies are arranged in sequence. Further, at least one module of the first isolated power supply 30A of the path A and at least one module of the second isolated power supply 30B of the path B may be symmetrically arranged along the width central axis I1-I1 of the power supply device 100.

In some embodiments, as shown in FIG. 4C, the isolated circuit module further comprises a plurality of primary switching devices 811 and a plurality of secondary switching devices 821, which are disposed on the PCB 90. The isolated circuit module is connected to the mainboard 60 of the power supply device via a primary pin 812 and a secondary pin 822 of the PCB 90. It can be understood that, in the application, the isolated power supplies 30 may further comprise other components, circuits, modules, or the like, which the application is not limited to.

Figure 4D:
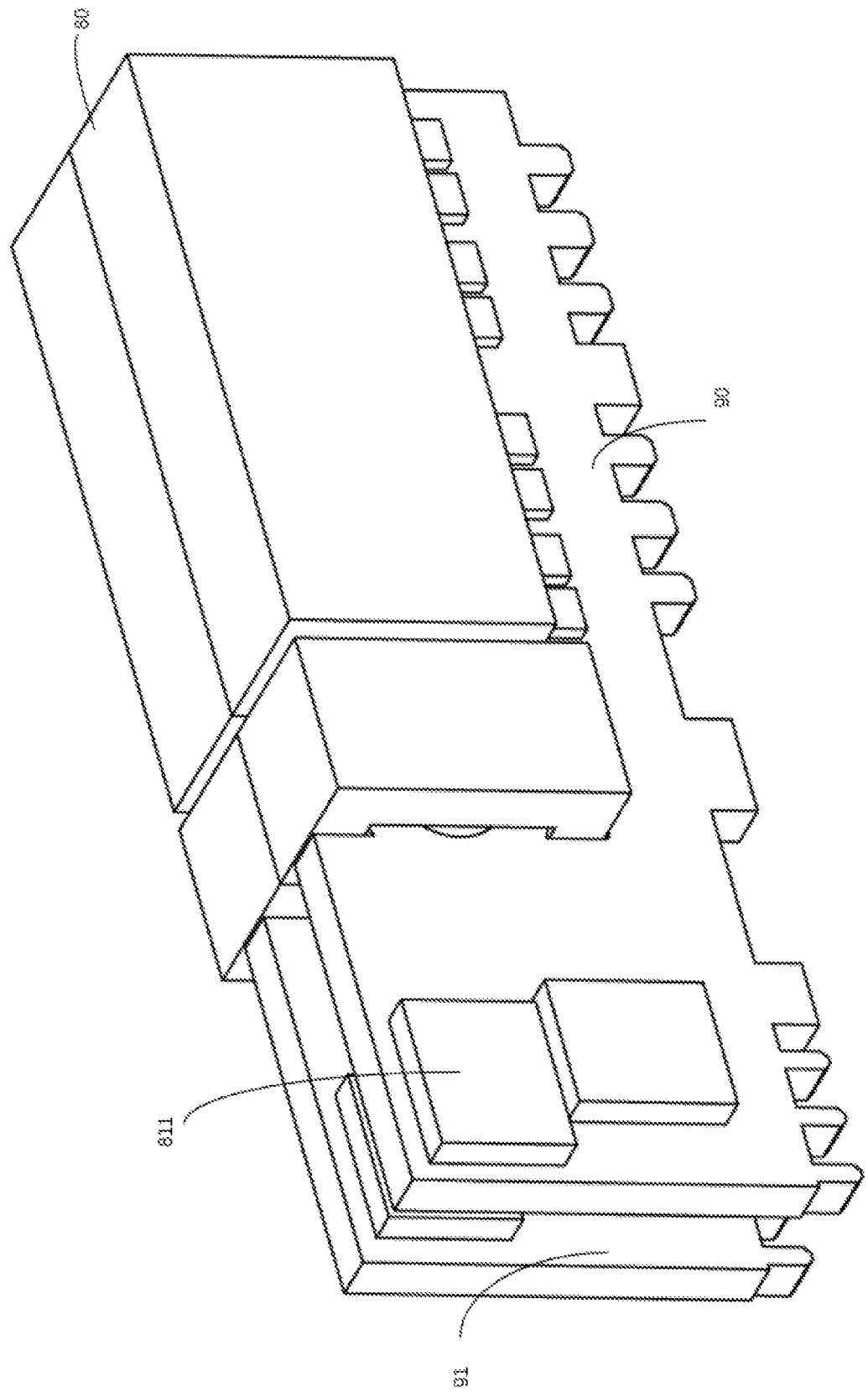
FIG. 4D is a structural diagram of another transformer in the isolated circuit module of the power supply device according to the application.

In some embodiments, as shown in FIG. 4D, the isolated circuit module may further comprise a plurality of PCBs, for example but not limited to, a PCB 90 and a PCB 91. The windings of the transformer 80 of the isolated circuit module may be formed by laying copper in the PCB 90 and the PCB 91. The magnetic core of the transformer 80 is inserted through and fixed on the PCB 90 and the PCB 91. Further, the windings of the transformers 80 in the PCB 90 and the PCB 91 may be connected with a copper sheet, or in other ways, which the application is not limited to. The creepage distance between the primary winding and the secondary winding of the transformer 80 can be adjusted by controlling the thickness and the number of the PCB layers where the primary winding and the secondary winding of the transformer 80 are located, so as to satisfy the insulating requirement between the primary winding and the secondary winding of the transformer 80 of the isolated circuit module of the isolated power supplies 30, and realizing double insulation.

As shown in FIG. 4A, in the application, the fan 20 is arranged at a first offset position relative to the width central axis I1-I1 of the power supply device. The first offset position may be arranged flexibly according to an actual circuit, which the application is not limited to. In this embodiment, the fan 20 is disposed at the front end of the power supply device 100 and placed centrically in the width direction. Moreover, the connector A of the path A and the connector B of the path B are arranged in parallel on the front panel. The venting holes in the front panel are concentrated between the connector A and the connector B and directly face to the fan 20. The air channel can be optimized by adjusting the height and spaces of components in front and/or back of the fan 20, to improve the heat emission efficiency.

As shown in FIG. 4A, in order to ensure the good heat dissipation of the main power modules, such as, the PFC module or the DC-DC module, in the application, the fan 20 is centrically placed. And the main power modules of the first isolated power supply 30A and that of the second isolated power supply 30B are separately arranged on both sides of the width central axis I1-I1 along the length direction of the power supply device to form good air channels. For example, passive modules/components (such as the EMI modules 34A, 34B, the capacitor modules 35A, 35B), modules emitting less heat (such as the auxiliary power supply modules 36A, 36B), and the control board 37B are placed on the sides of the power supply device, so that there is a trend of diversion to central air channel. The main heat generating modules/components (such as the PFC modules 31A, 31B, the DC-DC modules 32A, 32B, 33A, 33B) are placed in the middle of the power supply device along the length direction and maintained in a distance with the fan 20. In such way, the most of the heating elements can be well arranged in the air channel for heat-dissipation. Meanwhile, it can be ensured that the temperature of the air sucked by the fan 20 is uniform ensuring the fan 20 to work in a safe temperature environment. The layout shown in FIG. 4A is an optimal layout under such conditions. In some embodiments, when the rated power of the power supply device is lower or the heat generated by the power supply device is less, the main power modules of the first isolated power supply 30A of the path A and the second isolated power supply 30B of the path B may be placed on the sides of the power supply device along the width direction depending on the requirement.

As shown in FIG. 4A, a heatsink A of the PFC module 31A of the first isolated power supply 30A of the path A is very close to a heatsink B of the PFC module 31B of the second isolated power supply 30B of the path B. Therefore, an insulator 314 may be inserted between the heatsink A and the heatsink B, so as to increase a creepage distance between the two heatsinks. In some embodiments, as shown in FIG. 4B, one isolated power supply has a PFC module and a DC-DC module disposed on the mainboard, and a slot 70 is also provided on the mainboard between the two modules of the two isolated power supplies. The slot 70 is used to improve insulating effect between the first isolated power supply 30A of the path A and the second isolated power supply 30B of the path B, thereby satisfying the insulating requirement and the double insulation between the first isolated power supply 30A of the path A and the second isolated power supply 30B of the path B.

Figure 5:
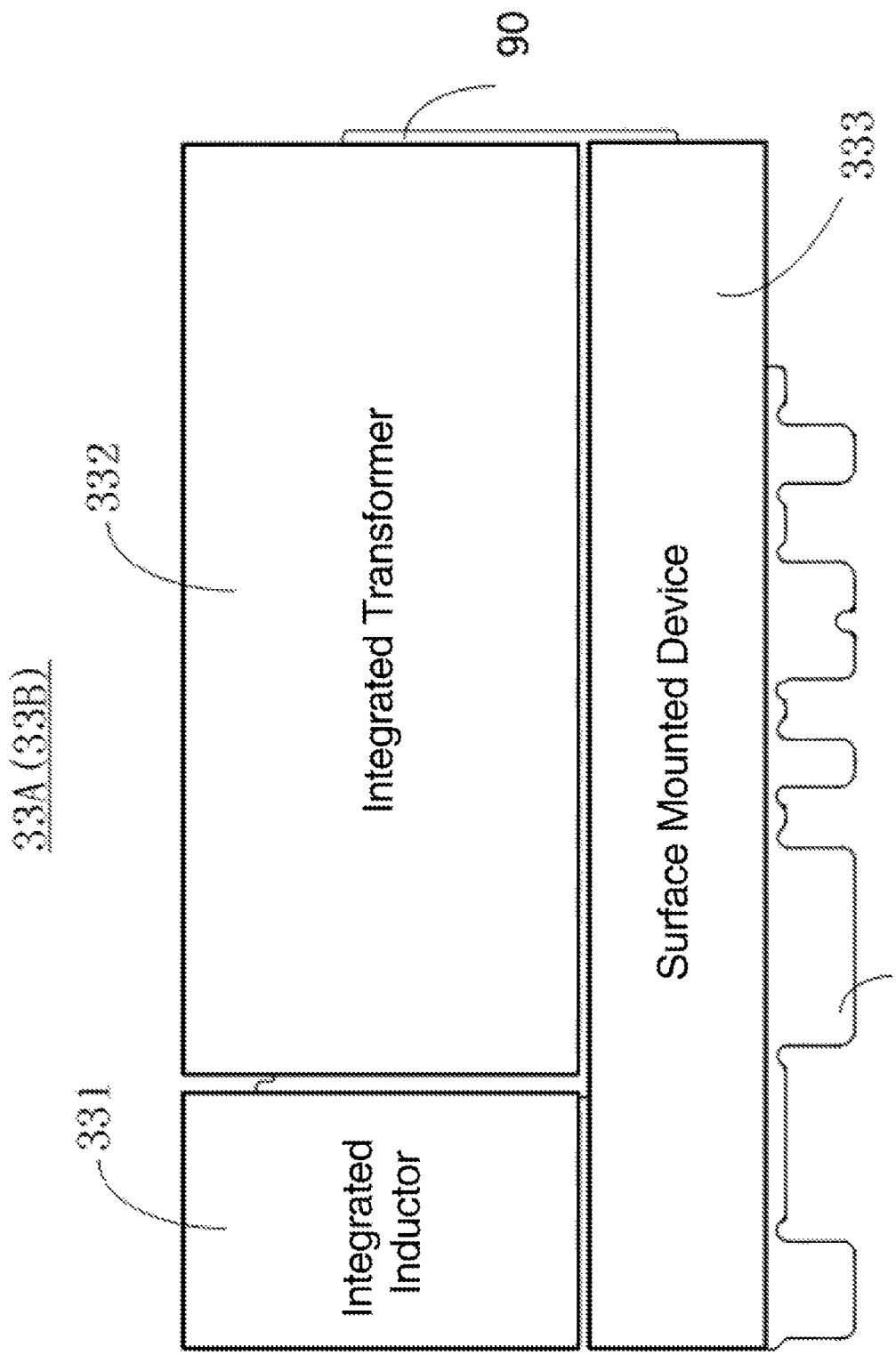
FIG. 5 is a structural diagram of a power convertor module, which can convert a direct current (DC) from one level to another level and is also called as DC-DC module, using the LLC topology in the power supply device according to the application.

As shown in FIG. 5, it illustrates the structure of the second part 33A of the DC-DC module A (or the second part 33B of the DC-DC module B) adopting a LLC topological circuit, i.e., the structure of the secondary circuit of the DC-DC module. The second part 33A of the DC-DC module A may be inserted into the mainboard 60 through a pin 822. Magnetic elements, such as, an integrated inductor 331 and an integrated transformer 332, are disposed at a position on the PCB 90 that is away from the mainboard 60. Surface Mounted Devices (SMD) 333, for example but not limited to switching devices, are attached under the magnetic elements, i.e., at a position on the PCB 90 that is close to the mainboard 60. It can be understood that the integrated inductor 331 and the integrated transformer 332 can be integrated in a magnetic core. Although the magnetic core is seriously blocked the wind, heat generation by the magnetic element is lower than the switching devices. Due to the existence of the larger magnetic element, the air channel that the PCB 90 is close to the mainboard is good, with a high wind velocity and a high heat emission efficiency. Meanwhile, the air channels in the regions at the sides of the second part 33A of the DC-DC module and of the second part 33B of the DC-DC module B where the auxiliary power supply modules 36A and 36B are disposed is smooth. The above layout can ensure that the entire power supply device obtains sufficient air flow for heat dissipation, thereby satisfying thermal requirement. It can be understood that the primary circuit part of the DC-DC module may also adopt similar structural layout, the details of which are not described here.

In the application, referring to FIG. 4A, a windshield filler 38 is further provided in a space between the fan 20 and the chassis 40 along the width direction of the power supply device 100 to prevent air-reflow generated by the fan 20 and improve the effective heat emission efficiency of the fan 20. Considering of the cost and usability, in the application, foams can be selected for partition and filing. It can be understood that in other embodiments of the application, devices, PCBs or other structures can be selected for partition and filing.

Figure 6:
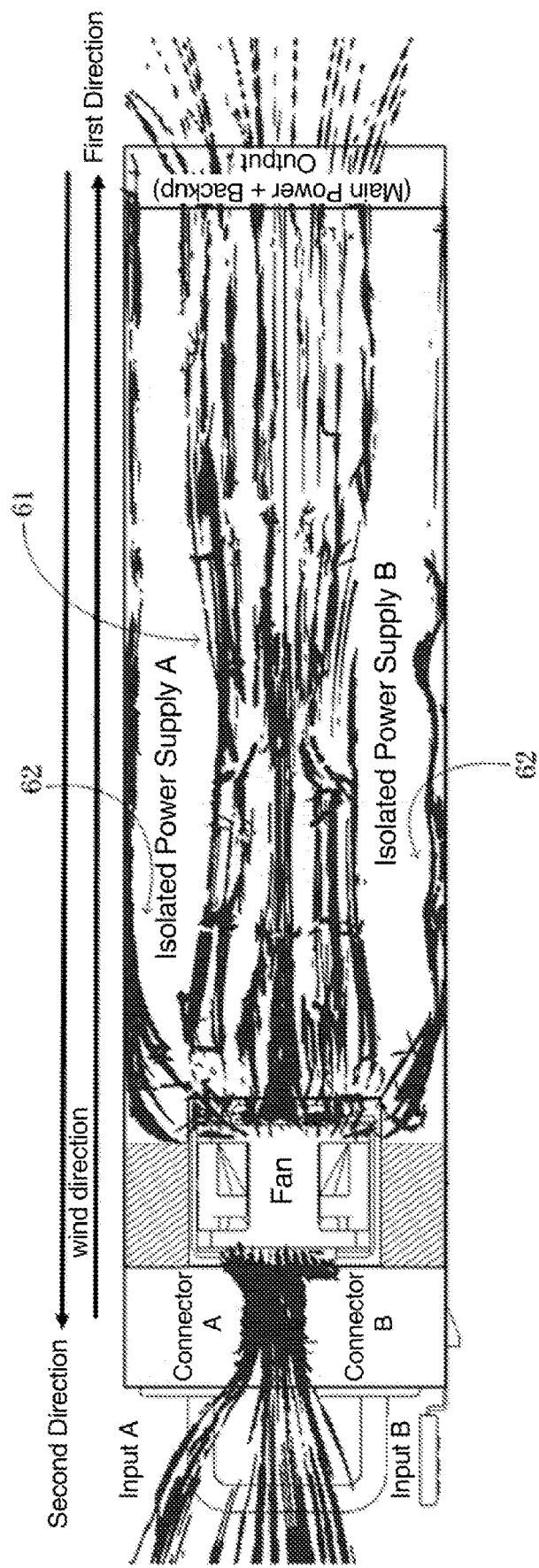
FIG. 6 is a schematic diagram of a thermal simulation result, showing a heat-dissipation air channel of the power supply device according to the application.

FIG. 6 shows the simulation of the heat-dissipation air channels of the power supply device of the application. As shown in FIG. 6, a central air channel 61 and side air channels 62 are formed in the center and both sides of the power supply device of the application, respectively. Moreover, the wind flow passing through the central main heat-emitting region is higher than that passing through both sides, which is consistent with the above analysis. In some embodiments, the two isolated power supplies 30 are disposed behind the air outlet of the at least one fan 20, so as to utilize the outputting wind from the at least one fan 20 to dissipate heat, with the wind direction in a first direction. In some embodiments, the two isolated power supplies 30 are disposed behind the air inlet of the at least one fan 20, so as to utilize the inletting wind of the at least one fan 20 to dissipate heat, with the wind direction in a second direction.

Figure 7:
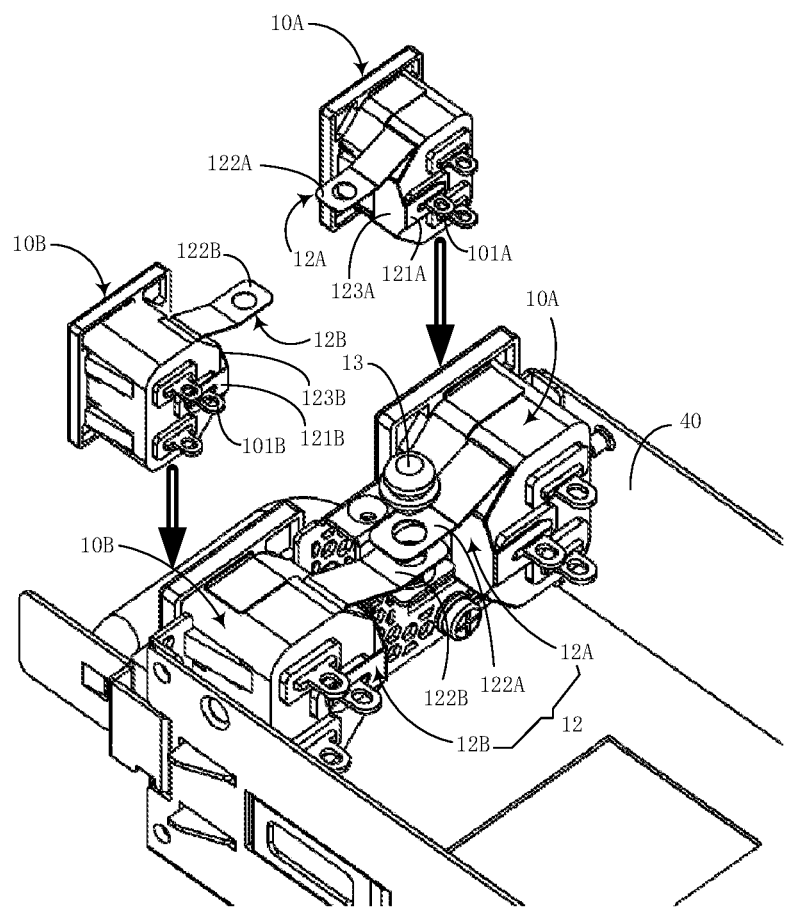
FIG. 7 is a diagram showing the two input ports commonly grounded by a grounding structure of the power supply device of the application.

In some embodiments, as shown in FIG. 7, in the application, the two input ports 10 (including 10A and 10B) can be commonly grounded at a grounding point via a grounding structure 12.

The grounding structure 12 may comprise a first grounding component 12A and a second grounding component 12B. The first grounding component 12A is correspondingly mounted on the first input port 10A and has a first connecting portion 121A and a first grounding portion 122A, wherein the first connecting portion 121A is soldered to the first grounding end 101A of the first input port 10A. The second grounding component 12B is correspondingly mounted on the second input port 10B and has a second connecting portion 121B and a second grounding portion 122B, wherein the second connecting portion 121B is soldered to the second grounding end 101B of the second input port 10B. The first grounding portion 122A, the second grounding portion 122B and the chassis 40 are connected to the grounding point via a connector 13 (e.g., a screw).

In some embodiments, in the application, a part of the first grounding component 12A further forms a first electromagnetic shield 123A, while a part of the second grounding component 12B further forms a second electromagnetic shield 123B. The application combines the EMI design and the space optimization design, and by eliminating the conventional PE jump wire at the input ports of the paths A and B, and a connector is utilized to fix the input inputs of both path A and path B to the chassis at the same grounding point, so as to save the internal space, improve the insulation effect, and optimize the heat-dissipation air channel.

Of course, it can be understood that in other embodiments of the application, the two input ports 10 (including 10A and 10B) can be grounded, respectively.

Figure 8:
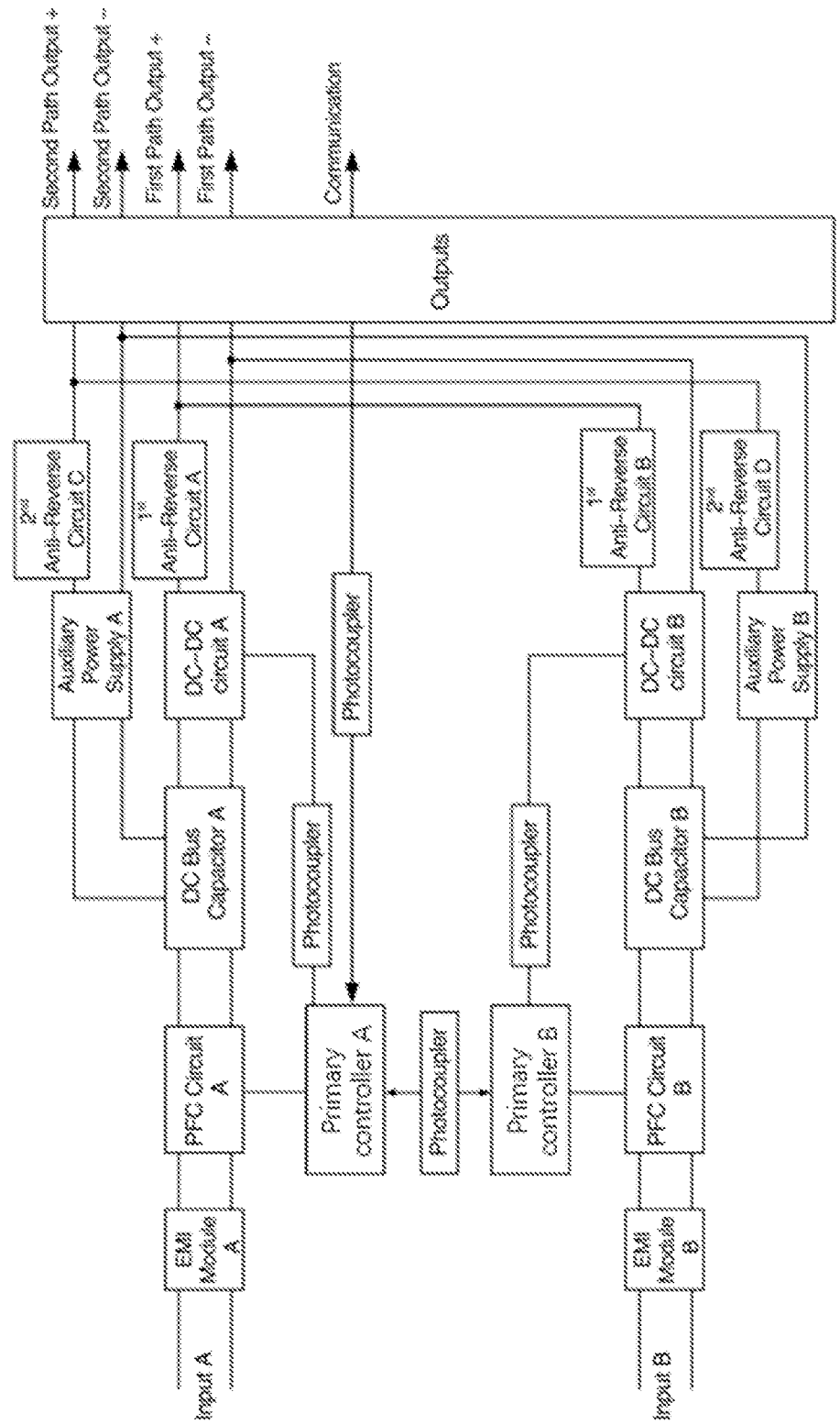
FIG. 8 is a first control schematic diagram of the power supply device according to the application.

As shown in FIG. 8, the double-input power supply device of the application has an input port A and an input port B, which may use double C14 connectors. Both the isolated power supply of the path A and the isolated power supply of the path B are in the two-stage topological structure, which has a front-stage being of a PFC circuit or a pre-voltage regulation circuit and a post-stage being of a DC-DC circuit. Moreover, the main power outputs at the output sides of the DC-DC circuits of the path A and the path B are respectively connected to a first anti-reverse circuit (e.g., an ORing circuit) and then connected in parallel to form one path output for supplying the load. For example, the main power outputs of the isolated power supply of the path A and the isolated power supply of the path B are respectively connected to a first anti-reverse circuit A and a first anti-reverse circuit B and then connected in parallel to form a first output. In some embodiments, as shown in FIG. 8, the isolated power supply of the path A and the isolated power supply of the path B may each comprise a bypass output. The bypass outputs from the isolated power supply of the path A and from the isolated power supply of the path B, are respectively connected to a second anti-reverse circuit C and a second anti-reverse circuit D and then connected in parallel to form a second output. The second anti-reverse circuit may be, for example, an ORing circuit.

In the application, each of the isolated power supplies may comprise at least one controller for controlling the isolated power supplies. Moreover, any one of the controllers of the two isolated power supplies may also be configured to communicate with an external system. Due to insulating requirement between the two paths of the isolated power supplies, each of the isolated power supplies has to use at least one controller for control. Since the double-input power supply is still one power supply for the external system, in order to facilitate the communicate with the external system, the application may use one of the controllers to complete the communication with the external system while controlling the isolated power supply of the path A or the isolated power supply of the path B. In some embodiments, the power supply device may also use other controller to communicate with the external system. The controller is, for example but not limited to, a grounding structure (MCU), a Digital Signal Processor (DSP), or the like.

As shown in FIG. 8, in this embodiment, two controllers are used for controlling. The PFC circuit A of the isolated power supply of the path A may be controlled by a primary controller A, while the PFC circuit B of the isolated power supply of the path B may be controlled by a primary controller B. The primary controller A and the primary controller B may be respectively coupled to a DC-DC circuit A and a DC-DC circuit B respectively through one photocoupler, to control the operation of the DC-DC circuit A and the DC-DC circuit B, respectively. Either of the primary controller A and the primary controller B may communicate with the external system via another photocoupler.

Figure 9:
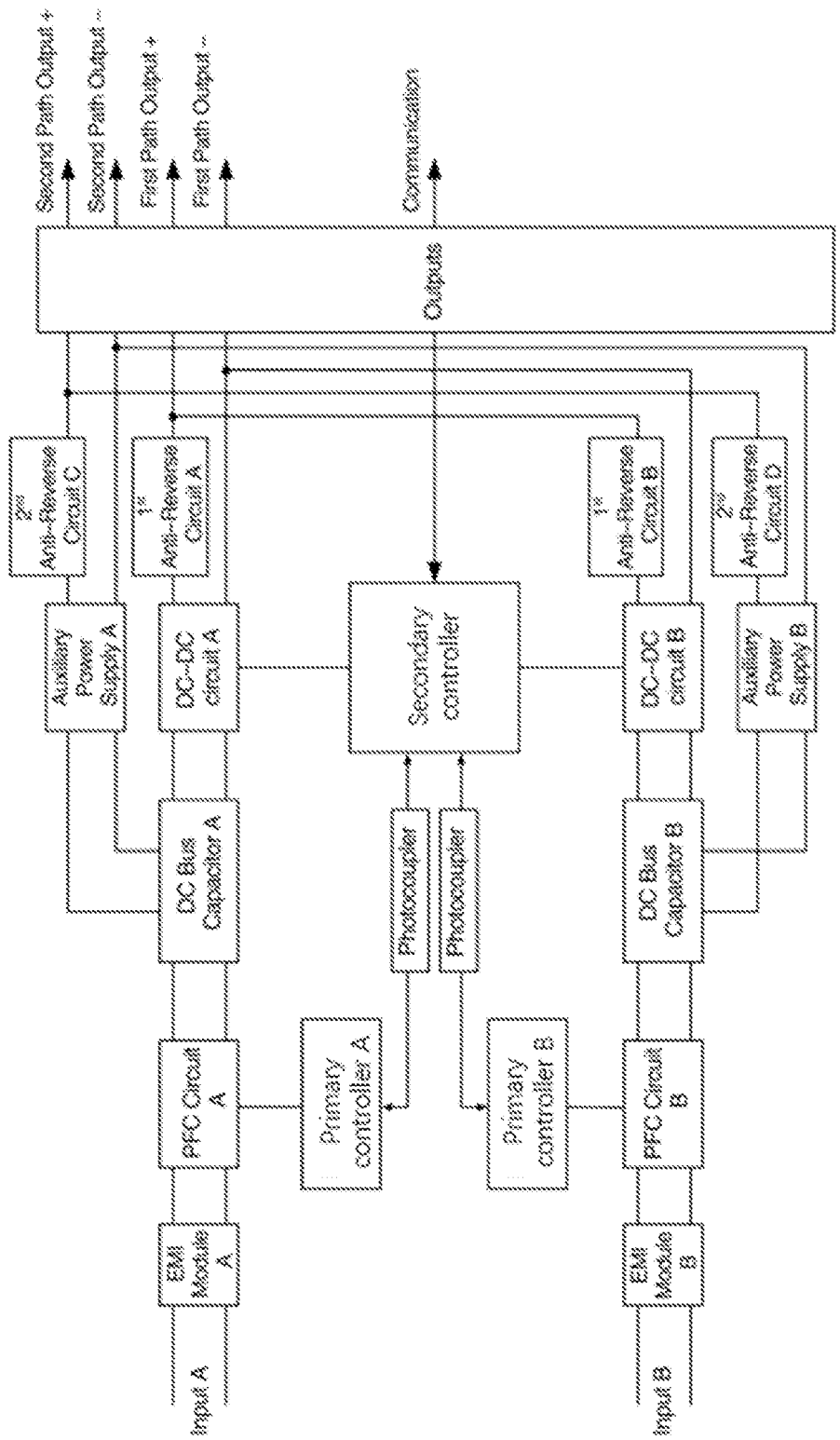
FIG. 9 is a second control schematic diagram of the power supply device according to the application.

As shown in FIG. 9, in this embodiment, three controllers are used for controlling. The PFC circuit A of the isolated power supply of the path A may be controlled by a primary controller A, while the PFC circuit B of the isolated power supply of the path B may be controlled by a primary controller B. The primary controller A and the primary controller B may be coupled to a secondary controller respectively through a photocoupler. The secondary controller can control the DC-DC circuit A of the isolated power supply of the path A and the DC-DC circuit B of the isolated power supply of the path B, while communicate with the external system.

Figure 10:
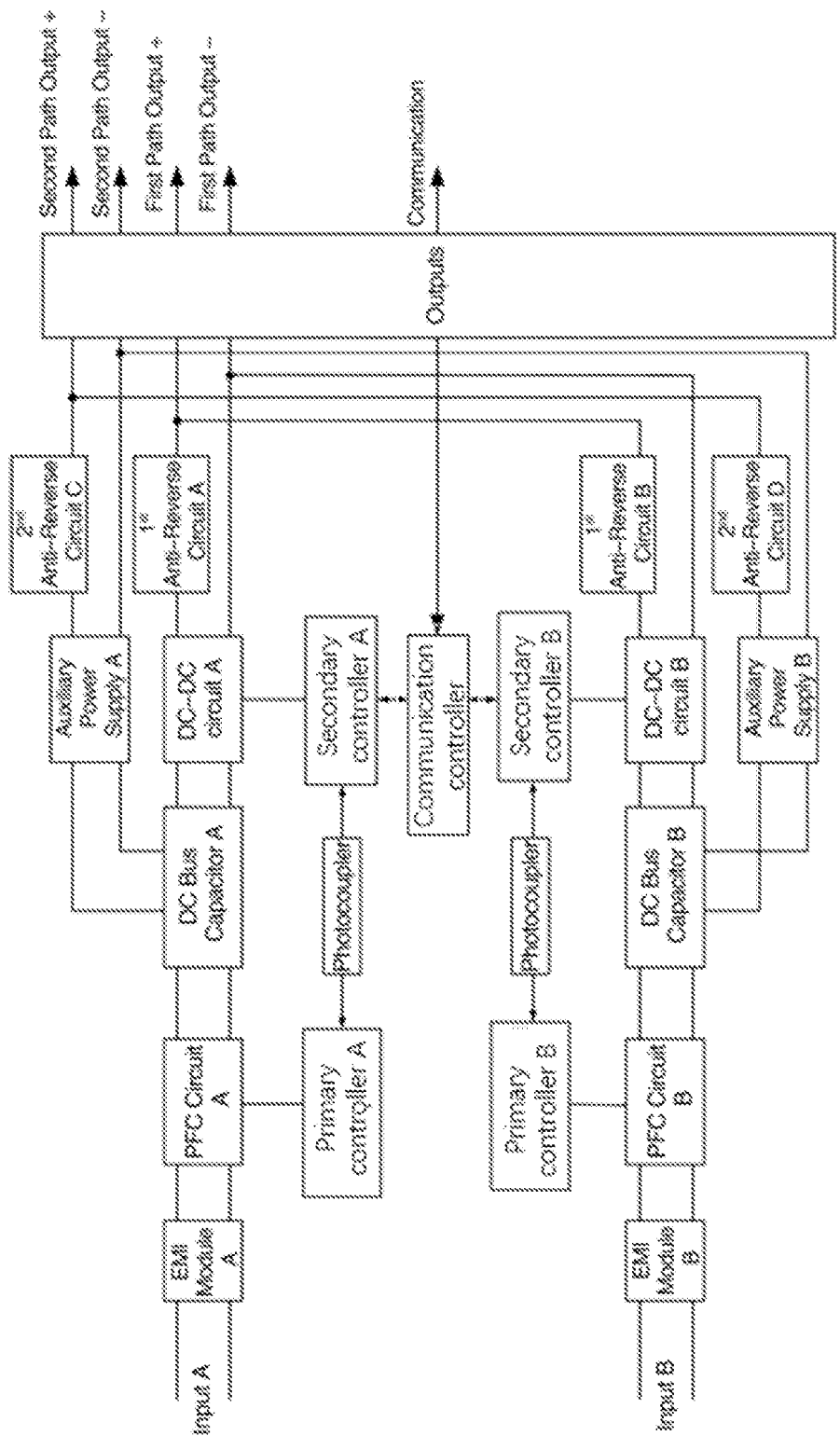
FIG. 10 is a third control schematic diagram of the power supply device according to the application.

As shown in FIG. 10, in this embodiment, five controllers may be used for controlling. Each of the two isolated power supplies comprise a primary controller and a secondary controller. The power supply device further comprises a communication controller. The PFC circuit A of the isolated power supply of the path A may be controlled by the primary controller A, while the PFC circuit B of the isolated power supply of the path B may be controlled by the primary controller B. The primary controller A and the primary controller B may be coupled respectively to the secondary controller A and the secondary controller B respectively through a photocoupler. The secondary controller A may control the DC-DC circuit A of the isolated power supply of the path A. The secondary controller B may control the DC-DC circuit B of the isolated power supply of the path B. The secondary controller A and the secondary controller B are connected to the communication controller and the communication control ship can communicate with the external system.

The application provides a power supply device with double paths of inputs, which can keep the original input connectors unchanged without changing the existing power distribution architecture, thus saving the production cost. For example, two power supply modules of 1.5 kW may be integrated into one power supply chassis. Compared with the traditional single-input power supply device, the components of the double-input power supply device of the application needs are doubled, making a big challenge in the aspects of insulation and heat dissipation of the double-input power supply device. To solve such problem, the double-input power supply device of the application adopts a module design, provides sufficient insulating distance and optimizes air channels, thereby improving heat dissipation capability and ensuring good heat dissipation effect.

The module designed double-input power supply device according to the application can significantly improve the supplying power of the data center without changing the total number of the power supplies. Since there is no need to replace the input ports, it is not necessary to modify the power distribution architecture of the existing data center, which significantly reduces the cost for capacity expansion of the data center. Meanwhile, since there is no need to change the output ports, the present application is compatible with the original system. By using the module design, not only the heat dissipation inside the power supply and the insulating performance between the isolated power supplies of two paths are improved, but also the manufacturability is improved while the production cost is reduced.

To sum up, the module designed double-input power supply device proposed by the application is a high-efficiency and low-cost solution for high power rated power supply that is suitable for the improvement of the existing data center.

Although several preferred embodiments of the present application have been described, the present application may be used with other configurations. It will be appreciated by those skilled in the art that, the present application could have many other embodiments, and changes and modifications may be made thereto without departing from the application in its broader aspects and as set forth in the following claims and equivalents thereof.

What is claimed is:

1. A power supply device comprising:
   two input ports disposed at a front end of the power supply device;
   at least one fan disposed behind the two input ports; and
   two isolated power supplies connected respectively to the corresponding one of the two input ports and disposed behind the two input ports and the at least one fan, each of the isolated power supplies comprising a main power circuit having at least one module, each module comprising a PCB and a magnetic element and/or switching devices disposed on the PCB,
   wherein the at least one module includes an isolated circuit module comprising a transformer having windings formed by laying copper in the PCB and a magnetic core fixed on the PCB, wherein the at least one fan is configured for heat dissipation of the at least one module.

2. The power supply device according to claim 1, wherein the power supply device further comprising a chassis, wherein the chassis forms a space for accommodating the two input ports, the at least one fan, and the two isolated power supplies.

3. The power supply device according to claim 1, wherein the isolated circuit module comprises a plurality of PCBs, the windings of the transformer of the isolated circuit module are formed by laying copper in the plurality of PCBs, and the magnetic core of the transformer is fixed on the plurality of PCBs.

4. The power supply device according to claim 1, wherein the at least one module further includes at least one of a PFC module, a DC-DC module, an EMI module, a capacitor module, and an auxiliary power supply module.

5. The power supply device according to claim 1, wherein the power supply device further comprising a mainboard and the at least one module further comprising a DC-DC module, wherein a PCB of the DC-DC module is plugged into the mainboard, the magnetic element of the DC-DC module is placed away from the mainboard, the switching devices of the DC-DC module is placed near to the mainboard, and an air channel is formed at a position near the switching devices and between the magnetic element and the mainboard.

6. The power supply device according to claim 1, wherein the at least one module of each of the two isolated power supplies further comprises a PFC module having a heatsink, and wherein an insulator is disposed between the heatsink of the PFC module of one of the two isolated power supplies and the heatsink of the PFC module of the other of the two isolated power supplies.

7. The power supply device according to claim 1, wherein the power supply device comprising the two isolated power supplies further comprises a mainboard, and wherein the at least one module of each of the two isolated power supplies further comprises a PFC module and/or a DC-DC module, wherein the at least one module of each of the two isolated power supplies is disposed on the mainboard and a slot is also provided on the mainboard between the at least one module of one of the two isolated power supplies and the at least one module of the other of the two isolated power supplies.

8. The power supply device according to claim 2, wherein a height of the chassis of the power supply device is 38 to 46 mm and a width of the chassis of the power supply device is 60 to 80 mm.

9. The power supply device according to claim 1, wherein the power supply device comprises two fans connected in series.

10. The power supply device according to claim 1, wherein the at least one fan is arranged at a first offset position relative to a width central axis of the power supply device, wherein the width center axis is parallel to a direction where the two input ports, the at least one fan and the two isolated power supplies are arranged in sequence.

11. The power supply device according to claim 2, wherein the at least one fan is placed centrically in a width direction of the power supply device, wherein the two input ports are arranged on a front panel of the chassis along the width direction of the power supply device and the front panel is provided with a plurality of venting holes concentrated between the two input ports and disposed corresponding to the at least one fan, wherein the width direction is perpendicular to a direction where the two input ports, the at least one fan and the two isolated power supplies are arranged in sequence.

12. The power supply device according to claim 2, wherein along a width direction of the power supply device, a space between the at least one fan and the chassis is provided with a windshield filler to prevent air reflow generated by the at least one fan, wherein the width direction is perpendicular to a direction where the two input ports, the at least one fan and the two isolated power supplies are arranged in sequence.

13. The power supply device according to claim 1, wherein the two input ports are grounded respectively.

14. The power supply device according to claim 2, wherein the two input ports are commonly grounded via a grounding structure.

15. The power supply device according to claim 14, wherein the grounding structure comprises:
   a first grounding component correspondingly mounted on a first input port of the two input ports and having a first connecting portion and a first grounding portion, wherein the first connecting portion is connected to a first grounding end; and
   a second grounding component correspondingly mounted on a second input port of the two input ports and having a second connecting portion and a second grounding portion, wherein the second connecting portion is connected to a second grounding end;
   wherein the first grounding portion, the second grounding portion and the chassis are connected to a grounding point via a connector.

16. The power supply device according to claim 15, wherein a part of the first grounding component further forms a first electromagnetic shield, and a part of the second grounding component further forms a second electromagnetic shield.

17. The power supply device according to claim 1, wherein the two input ports are C14 connectors or C20 connectors.

18. The power supply device according to claim 1, wherein an input of the isolated power supply is an AC input or a DC input.

19. The power supply device according to claim 1, wherein each of the isolated power supplies has a main power output, and two main power outputs of the two isolated power supplies are respectively connected to a first anti-reverse circuit and then connected in parallel to form a first output.

20. The power supply device according to claim 19, wherein each of the isolated power supplies further has a bypass output, and two bypass outputs of the two isolated power supplies are respectively connected to a second anti-reverse circuit and then connected in parallel to form a second output.

21. The power supply device according to claim 1, wherein the isolated power supply is a single-stage circuit.

22. The power supply device according to claim 1, wherein the isolated power supply is a two-stage circuit comprising a front-stage circuit and a post-stage circuit, wherein the front-stage circuit is a PFC circuit or a pre-voltage regulation circuit, and the post-stage circuit is a DC-DC circuit.

23. The power supply device according to claim 1, wherein each of the isolated power supplies comprises at least one controller for controlling the isolated power supply.

24. The power supply device according to claim 23, wherein either of the controller of the two isolated power supplies is configured for communicating with an external system.

25. The power supply device according to claim 23, the power supply device further comprising an additional controller for communicating with an external system.

\* \* \* \* \*